United States Patent
Menkus et al.

(10) Patent No.: US 7,332,904 B1
(45) Date of Patent: Feb. 19, 2008

(54) ON-CHIP RESISTOR CALIBRATION APPARATUS AND METHOD

(75) Inventors: Christopher Alan Menkus, Munich (DE); Robert Callaghan Taft, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/046,576

(22) Filed: Jan. 28, 2005

(51) Int. Cl.
*G01R 31/02* (2006.01)

(52) U.S. Cl. .................. 324/158.1; 324/763; 324/601

(58) Field of Classification Search .................. None
See application file for complete search history.

(56) References Cited

U.S. PATENT DOCUMENTS

| | | | | |
|---|---|---|---|---|
| 5,254,883 | A * | 10/1993 | Horowitz et al. | 326/30 |
| 5,371,425 | A * | 12/1994 | Rogers | 327/3 |
| 5,600,272 | A * | 2/1997 | Rogers | 327/157 |
| 5,680,060 | A * | 10/1997 | Banniza et al. | 326/30 |
| 5,717,321 | A * | 2/1998 | Kerth et al. | 323/283 |
| 5,886,529 | A * | 3/1999 | Wakamatsu | 324/601 |
| 6,281,687 | B1 * | 8/2001 | Shepston | 324/601 |
| 6,288,564 | B1 * | 9/2001 | Hedberg | 326/30 |
| 6,424,200 | B1 | 7/2002 | McNitt et al. | 327/308 |
| 6,541,996 | B1 * | 4/2003 | Rosefield et al. | 326/30 |
| 6,566,904 | B2 * | 5/2003 | van Bavel et al. | 326/30 |
| 6,586,964 | B1 * | 7/2003 | Kent et al. | 326/30 |
| 6,674,302 | B2 * | 1/2004 | Yen | 326/30 |
| 6,768,393 | B2 * | 7/2004 | Song | 333/22 R |
| 6,825,490 | B1 * | 11/2004 | Hook et al. | 257/48 |
| 6,842,710 | B1 * | 1/2005 | Gehring et al. | 702/107 |
| 6,946,848 | B2 * | 9/2005 | Tauber et al. | 324/601 |
| 2003/0098735 | A1 | 5/2003 | Jaussi et al. | 327/530 |
| 2003/0117147 | A1 | 6/2003 | Song | 324/601 |
| 2004/0108881 | A1 | 6/2004 | Bokui et al. | 327/334 |

OTHER PUBLICATIONS

National Semiconductor Corporation, "A/D Converter," web article, *Signal News*, 2004 (2 pages).
National Semiconductor, "ADC08D1000 High Performance, Low Power, Dual 8-Bit, 1 GSPS A/D Converter," Sep. 2004 (31 pages).
Peter Scholtens et al., A 6b 1.6GSample/s Flash ADC in 0.18 μm CMOS using Averaging Termination (3 pages), *ISSCC*, Feb. 5, 2002.

* cited by examiner

*Primary Examiner*—Paresh Patel
(74) *Attorney, Agent, or Firm*—Brett A. Hertzberg; Merchant & Gould PC

(57) ABSTRACT

An on-chip resistor is calibrated with a sense circuit that compares a resistance associated with an off-chip resistor to the on-chip resistor via a current-mirror circuit and a comparator. A digital counter circuit evaluates the comparison and adjusts its count such that a variable digital control signal is provided to the on-chip resistor circuit. During the calibration of the on-chip resistor circuit, the resistance of the on-chip resistor can be matched to the resistance of the off-chip resistor according to a scaling factor (e.g., 1×, 2×, 2.5×, 10×, etc.) as may be desired. Once the resistance associated with the on-chip resistor circuit is sufficiently adjusted, another on-chip resistor (e.g., a terminating resistor of another circuit) can be adjusted from the counter value. Various other circuits can be disabled during the calibration of the on-chip resistor such that additional sources of error (e.g., supply variation, ground bounce, noise, etc.) are minimized.

15 Claims, 5 Drawing Sheets

ON-CHIP RESISTOR CALIBRATION APPARATUS AND METHOD

FIELD OF THE INVENTION

The present disclosure generally relates to integrated circuits that include resistors. More particularly, the present disclosure relates to an on-chip resistor that is calibrated with circuits that includes a digital counter, a comparator, a set of current sources, and an off-chip resistor that is used as a reference.

BACKGROUND

Electronic systems can often be implemented in a microelectronic circuit that is typically referred to as an IC or integrated circuit. These electronic systems typically include a number of passive and active electronic components, including but not limited to: resistors, capacitors, inductors, logic gates, linear amplifiers, voltage regulators, signal processors and converters, to name a few.

Integrated circuits are typically created on a single silicon wafer, where the silicon is processed through deposition, doping, etching, and other semiconductor processes to create the various electrical characteristics that make the circuit functions. Since the integrated circuit is typically made from a single substrate, there are limited number of materials (e.g., metal, poly-silicon, dielectric, doped silicon, etc.) that are available to make the various electrical components. As a consequence of the limited materials available, it is often the case that the "chip" or IC solution of the original system concept cannot be realized using the same types of passive components (resistors, capacitors, inductors, etc) as the system design. In short, it is physically impossible to create certain varieties of electrical components on an integrated circuit in the same manner as their discrete circuit equivalents. However, creative integrated circuit designers have found that various integrated circuit materials such as diffusion and poly-silicon can be used to create passive components such as resistors and capacitors.

Although it is possible to create passive components on an integrated circuit, many of these passive components exhibit characteristics that simply did not exist for their passive component equivalents. For example, a resistor in an integrated circuit may have capacitive characteristics that simply did not exist in a discrete resistor. Moreover, due to limitations in integrated circuit processes, it is impracticable to use high precision passive components (e.g., resistors accurate to 1% of their designed value) in an integrated circuit, where resistance values can typically vary by 20% or more from their nominal value.

Integrated circuit designers have developed a variety of ways to adjust resistor values on an integrated circuit such that improved circuit performance can be achieved. In one example, fuse and/or anti-fuse technologies have been used to allow an adjustment to the nominal resistance of a particular component in the circuit. In another example, a thin film layer has been deposited on the surface of the integrated circuit that includes high precision resistors that can be adjusted by a laser beam trimming system. In other examples, circuit designers have changed the overall circuit topology such that the high-precision resistor values are not required in the system on a chip (SOC) implementation.

BRIEF DESCRIPTION OF THE DRAWINGS

Non-limiting and non-exhaustive embodiments are described with reference to the following drawings.

DETAILED DESCRIPTION

Figure 1:
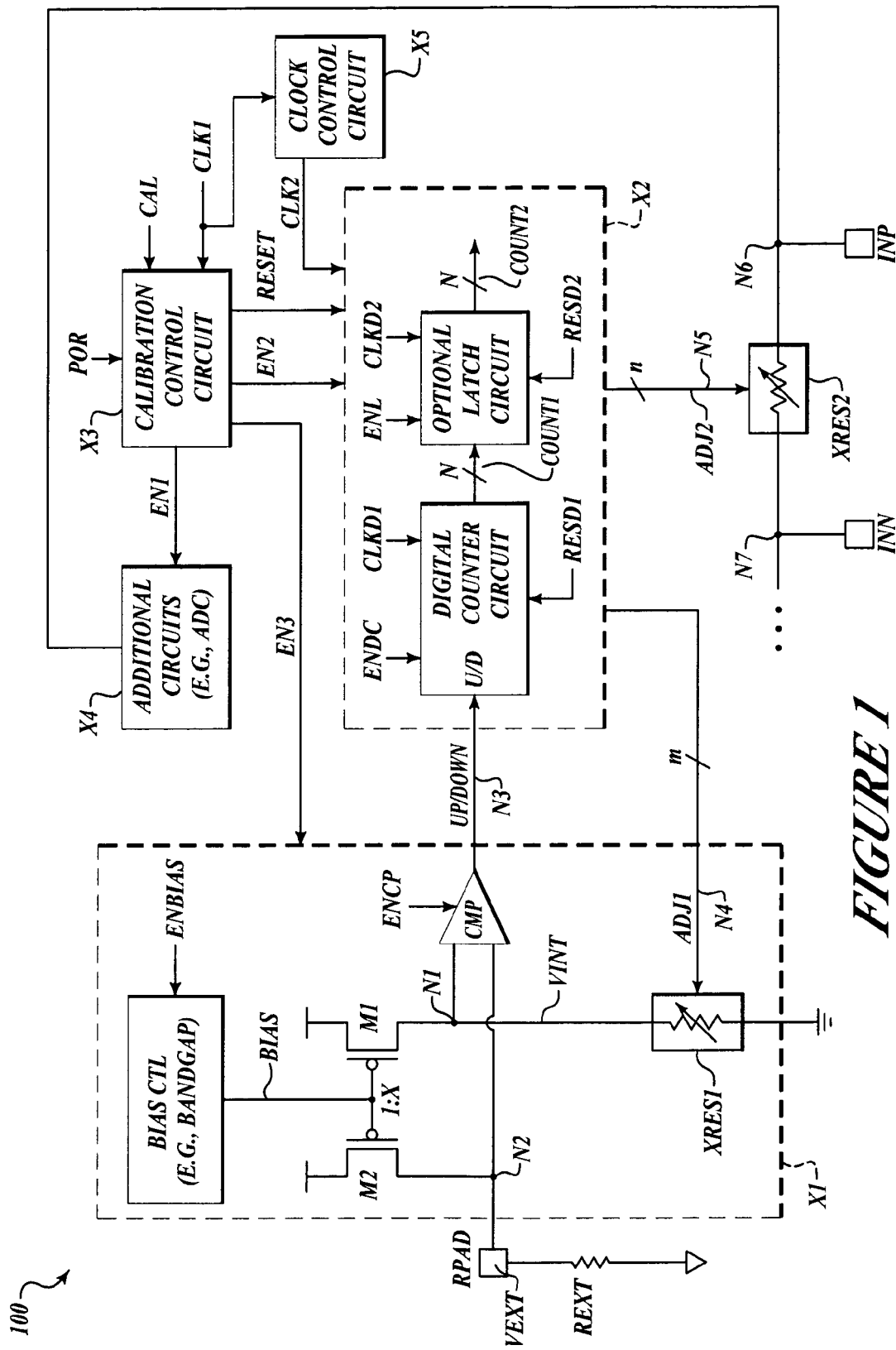
FIG. 1 is an illustrative schematic diagram of an example on-chip resistor calibration system.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity Briefly stated, the present disclosure generally relates to integrated circuits that require a calibrated on-chip resistor. The on-chip resistor is calibrated with a sense circuit that compares a resistance associated with an off-chip resistor to the on-chip resistor via a current-mirror circuit and a comparator. A digital counter circuit evaluates the comparison and adjusts its count such that a variable digital control signal is provided to the on-chip resistor circuit. During the calibration of the on-chip resistor circuit, the resistance of the on-chip resistor can be matched to the resistance of the off-chip resistor according to a scaling factor (e.g., 1×, 2×, 2.5×, 10×, etc.) as may be desired. Although exact values of on-chip resistance can vary due to process, and environmental conditions, matching between like resistor materials in comparable circuit arrangements can be fairly precise. Once the resistance associated with the on-chip resistor circuit is sufficiently adjusted, another on-chip resistor (e.g., a terminating resistor of another circuit) can be adjusted from the counter value. Various other circuits can be disabled during the calibration of the on-chip resistor such that additional sources of error (e.g., supply variation, ground bounce, noise, etc.) are minimized.

Resistor Calibration System

FIG. 1 is an illustrative schematic diagram of an example on-chip resistor calibration system (100). Resistor calibration system 100 may be arranged as at least a portion of an integrated circuit. The integrated circuit may include a set of external connection ports as designated by RPAD, INN, and INP. In addition to integrated circuit implementations, the disclosure that follows below may also be applied to non-integrated circuit solutions. On-chip calibration system 100 includes a sensing circuit (X1), an up/down counter circuit (X2), a calibration control circuit (X3), additional circuits (X4), a clock control circuit (X5), a reference resistor (REXT), and an adjusted (e.g., on-chip) resistance circuit (XRES2).

Sensing circuit X1 includes a current mirror circuit (transistors M1 and M2), a comparator circuit (CMP), a bias control circuit (BIAS CTL), and a variable resistance circuit (XRES1). The bias control circuit has an input that is coupled to signal ENBIAS, and an output that corresponds to signal BIAS. Transistor M1 is coupled between power and node N1, and includes a control terminal that is coupled to signal BIAS. Transistor M2 is coupled between power and node N2, and includes a control terminal that is coupled to signal BIAS. The variable resistance circuit (XRES1) is coupled between node N1 and a circuit ground (e.g., an on-chip ground), and a control terminal that is coupled to signal ADJ1 at node N4. Comparator circuit CMP includes a first input that is coupled to node N1, a second input that is coupled to node N2, a third input that is coupled to signal ENCP, and an output that is coupled to node N3. Resistor REXT is coupled between node N2 and another circuit ground (e.g., an off-chip ground).

When enabled for operation (e.g., via EN2 and EN3), sensing circuit X1 and up/down counter circuit (X2) cooperate with one another. Sensing circuit X1 provides a signal at node N3 that corresponds to an up/down control signal for the up/down counter circuit (X2). The up/down counter circuit (x2) is responsive to the up/down control signal and varies a value (e.g., an m-bit digital control word) associated with adjustment signal ADJ1, and also varies another value (e.g., an n-bit digital control word) associated with adjustment signal ADJ2.

A resistance value associated with variable resistance circuit XRES1 in sensing circuit X1 is varied in response to the value associated with adjustment signal ADJ1 from up/down counter circuit X2. Transistors M1 and M2 in sensing circuit X1 are biased to operate as current sources that are responsive to signal BIAS. Transistor M1 is arranged to couple a first current to the variable resistance circuit (XRES1) such that a first voltage (VINT) is developed at node N1. Transistor M2 is arranged to couple a second current to resistor REXT such that a second voltage (VEXT) is developed at node N2. Comparator circuit CMP is arranged to compare the first and second voltages to provide the up/down control signal in response thereto.

The ratio of the first current to the second current is determined by a scaling factor (e.g., 1:X, X:Y, X:1, etc.) that is associated with the relative sizes of transistors M1 and M2. Although FIG. 1 illustrates transistors M1 and M2 as single transistors, each of the transistors may be represented as an array of transistors that are configured to provide a desired effective size (e.g., channel width and length). By scaling the relative sizes (e.g., W1/L1 is scaled relative to W2/L2) of transistors M1 and M2, the magnitude of the first and second currents is also scaled. For example, when transistor M1 is smaller than transistor M2 in relative size (e.g., W2/L2=X*W1/L1), transistor M2 will provide a current with a magnitude that is substantially "X" times larger than another current that is provided by transistor M1. Similarly, when transistor M1 is larger than transistor M2 (e.g., W1/L1=X*W2/L2), transistor M1 will provide a current with a magnitude that is substantially "X" times larger than another current that is provided by transistor M2.

In one example, REXT has a value of 10K, and XRES1 has an adjusted effective resistance value of 1K when the transistors M1 and M2 have a relative scaling factor (X) corresponding to 10:1. In another example, REXT has a value of 10K and XRES1 has an adjusted effective resistance value of 100K when transistors M1 and M2 have a relative scaling factor (X) corresponding to 1:10. Other values of resistance and scaling factors may also be employed to achieve a desired range of adjustable resistance and precision.

BIAS CTL can be implemented as any appropriate biasing arrangement for transistors M1 and M2 including, a resistor in series with a diode, a band-gap circuit, or some other biasing arrangement. The BIAS CTL circuit can be arranged to include a disable feature that is responsive to the ENBIAS signal such that transistors M1 and M2 are disabled from operation. Similarly, comparator circuit CMP can include a disable feature that is responsive to the ENCP signal such that the comparator is disabled from operation. Additional logic and signal conditioning circuits (not shown) can be used to control the signals ENCP and ENBIAS in response to signal EN3 within sense circuit X1.

Up/Down counter circuit X2 includes a digital counter circuit and an optional latch circuit. The digital counter circuit includes a first input that is coupled to node N3, a second input that is coupled to signal ENDC, a third input that is coupled to signal CLKD1, a fourth input that is coupled to signal RESD1, and an output that corresponds to signal COUNT1. The optional latch circuit includes a first input that is coupled to signal COUNT1, a second input that is coupled to signal ENL, a third input that is coupled to signal CLKD2, a fourth input that is coupled to signal RESD2, and an output that corresponds to signal COUNT2. The outputs of up/down counter circuit X2 are derived from at least one of signals COUNT1 and COUNT2, and are coupled to nodes N4 and N5 as adjustment signals ADJ1 and ADJ2, respectively. The Up/Down counter circuit (X2) is arranged to selectively evaluate (e.g., in response to signal CLK2) the up/down control signal to change the adjustment control signals (ADJ1, ADJ2) when enabled (e.g., via signal EN2).

The digital counter circuit may be arranged to have an initialization condition that is responsive to signal RESD1. In one example, the digital counter is arranged to clear COUNT1 (an N-bit digital quantity) to all zeros. In another example, the digital counter is arranged to initialize COUNT1 to a preloaded count condition such as half-way between 0 and a full count. In still another example, the digital counter is arranged to initialize COUNT1 to a preloaded count condition from a memory location such as a ROM, an EPROM, an EEPROM, etc. The digital counter circuit may be arranged to have a disable condition that is responsive to signal ENDC, and effective to disable the counter and/or minimize power consumption related to the circuit.

The optional latch circuit is arranged to selectively store therein (e.g., in response to signals CLKD2 and ENL) a counter value that is associated with COUNT1. The optional latch circuit may be arranged to have an initialization condition (e.g., clear latch to all zeros) that is responsive to signal RESD2. The optional latch circuit may also be arranged to have a disable condition that is responsive to signal ENL, and effective to disable the latch from changing the values stored therein associated with COUNT2. The optional latch circuit may be replaced by another memory circuit, an EPROM, an EEPROM, or some other appropriate device that maintains signal COUNT2.

Adjusted resistance circuit XRES2 is coupled between nodes N6 and N7, and includes a control input that is coupled to signal ADJ2 at node N5. The adjusted resistance circuit has an effective resistance between nodes N6 and N7 that is variable in response to signal ADJ2. Variable resistance circuit XRES1 and Adjusted resistance circuit XRES2 are related to one another (e.g., constructed from similar materials, using similar resistor segments, etc.) such that the effective resistance between nodes N6 and N7 is calibrated.

Additional logic and/or signal conditioning circuits (not shown) may be necessary to gate, decode, or otherwise process signals COUNT1 and/or COUNT2 for proper use as adjustment signals (ADJ1, ADJ2). Signals ENL, ENDC, CLKD1, CLKD2, RESD1, and RESD2 may be derived from a number of input signals to the up/down counter circuit such as, for example, signals CLK2, EN2, and RESET. In another example, the latch circuit may be unnecessary since the output of the digital counter circuit may be arranged to maintain the counter output when disabled.

Calibration control circuit X3 includes a first input that is coupled to signal CAL, a second input that is coupled to signal CLK1, a third input that is coupled to signal POR, a first output that corresponds to signal EN1, a second output that corresponds to signal EN2, a third output that corresponds to signal EN3, and a fourth output that corresponds to signal RESET. Additional circuits X4 includes an input that is coupled to signal EN1, and at least one other terminal that is coupled to adjusted resistance circuit XRES2 at node N5 and/or node N6. Although the additional circuits (X4) are not directly related to the on-chip calibration system, the additional circuits (X4) benefit from the resulting on-chip resistance calibration as a result thereof by way of performance enhancements to the calibrated value of the adjusted resistance circuit. In one example, the adjusted resistance circuit (XRES2) corresponds to an on-chip (on-die) terminating resistor that is coupled between terminals INN and INP. In another example, at least one of nodes N5 and N6 are sensed by additional circuits such as with a single ended signal sensing circuit, a differential signal sensing circuit (e.g., an LVDS receiver), etc. Clock control circuit X5 may be arranged to gate (e.g., selectively enable or disable), multiply, divide, or otherwise conditions signal CLK1 to provide signal CLK2.

Resistor calibration system 100 may be arranged to include multiple operating modes as may be necessary for desired performance. In one example, the calibration portions of the system are disabled when the additional circuits are enabled for normal operation. In another example, the calibration portions of the system are enabled when the additional circuits are disabled from their normal operation. When high precision calibration is required, various circuits in the system may be selectively enabled and/or disabled to minimize noise levels in the system during the calibration sequence. The calibration control circuit may be arranged to coordinate or otherwise control the selection of the operating mode of the system. In one example, calibration control circuit X3 is arranged to activate a calibration cycle after a power on reset condition has been activated in response to signal POR. In another example, the calibration control circuit X3 is arranged to activate a calibration cycle in response to a calibration control signal (CAL).

Power-supply, ground return, and other internal connections in an integrated circuit have a variety of parasitic characteristics (e.g., capacitance, resistance, inductance, etc.) that are due to the physical limitations of circuit design. In one example, a bond-wire between a bonding pad of an integrated circuit and a lead-frame of the integrated circuit package may have inductive, resistive, and capacitive properties. The signal path on the integrated circuit chip (or die) may also have resistive, inductive, and capacitive properties that are the result of the close proximity of adjacent signals, the length distance that the signal traces across the die, and the width of the physical metal (or other material) that electrically couples the signal from the circuit to the bonding pad, for example. As currents and voltages flow through the various circuits, non-ideal effects can be observed as a result of the physical circuit implementation including the parasitic characteristics. Example non-ideal effects include: signal crosstalk, ground-bounce, local power supply voltage fluctuations, charge-injection, noise, as well as others. These and other non-ideal effects may result in errors for the calibration of the on-chip resistor(s). The calibration system may be arranged such that unnecessary circuits (e.g., additional circuits X4) can be disabled during calibration such that the total operating current running through the various circuits and signal traces are minimized (minimizing ground bounce effects and supply fluctuations), charge injection, signal cross-talk, and noise errors are minimized, and the calibration of the on-chip resistor values has minimal errors.

Example Variable Resistance Circuits

Figure 2:
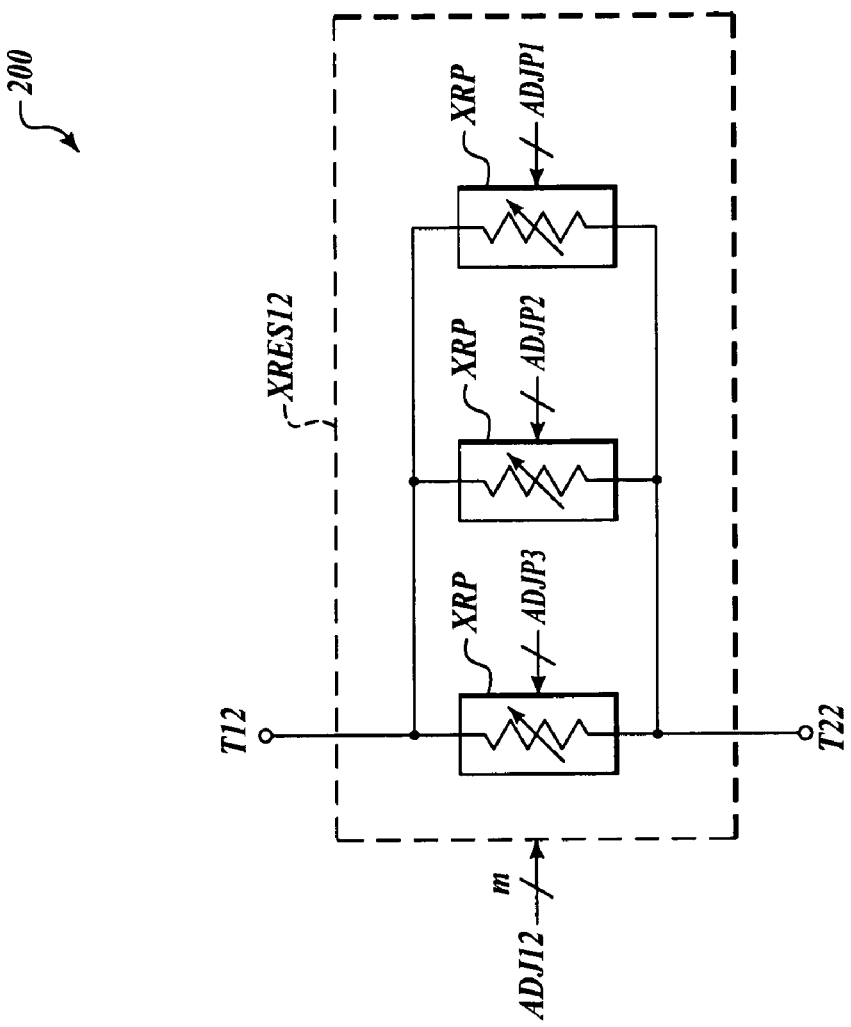
FIG. 2 is an illustrative schematic diagram for example adjustable resistance circuits that may be utilized by an on-chip resistor calibration system.
Figure 2:
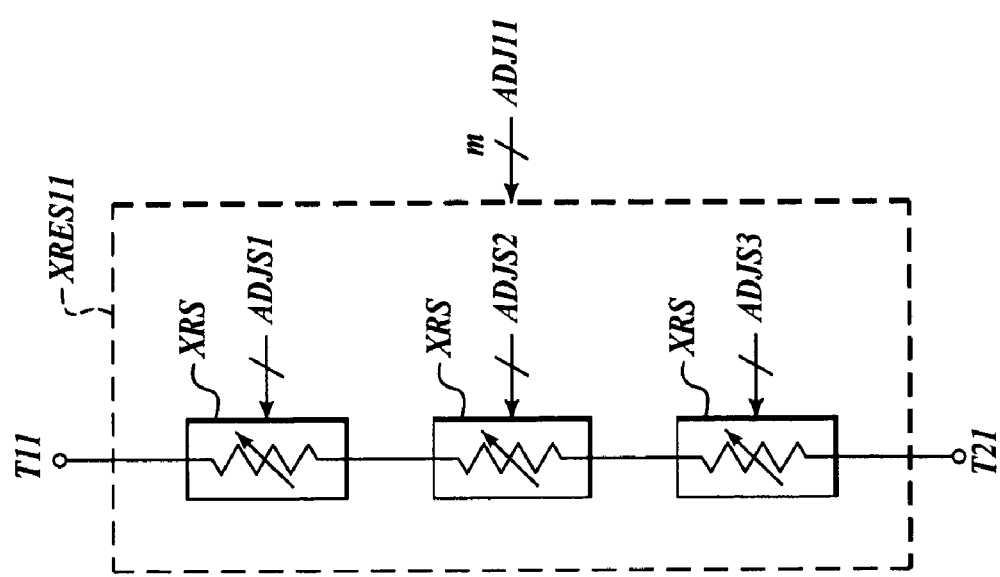

FIG. 2 is an illustrative schematic diagram (200) for example adjustable/variable resistance circuits (e.g., XRES1, XRES2 from FIG. 1) that may be utilized by an on-chip resistor calibration system. Each resistance circuit includes a control terminal (e.g., ADJ11, ADJ12) that is a multi-bit (e.g., m-bit) digital control word. Each resistance circuit also includes two other terminals (e.g., T11/T21, T12/T22), where the effective resistance between the two terminals may be varied in response to the control signal that is coupled to the control terminal.

Resistance circuit XRES11 has an effective resistance between terminals T11 and T21 that may be varied in response to signal ADJ11. The resistance circuit (XRES11) includes multiple variable resistor circuits (XRS) that are coupled together in series between terminals T11 and T21. Each of the variable resistor circuits (XRS) may be matched to one another, or scaled relative to one another (e.g., according to a binary weighting scheme, linear weighting, logarithmically weighted, etc.) as may be necessary to provide an overall adjustment range for the effective resistance between terminals T11 and T21. In one example, a decode circuit (e.g., a logic circuit such as a two-to-four decoder, etc.) is arranged to selectively adjust each of the variable resistor circuits (XRS) in response to the adjustment signal (ADJ11) such that separate adjustment signals (ADJS1, ADJS2, ADJS3, . . . ) are used by each variable resistor circuit (XRS). In another example, another decode circuit is arranged to selectively adjust each of the variable resistor circuits (XRS) in response to the same adjustment signal (e.g., ADJS).

Additional decode circuit arrangements can be implemented to provide different adjustments methods such as: binary weighted, linear, logarithmic, as well as others. One example decode circuit comprises a set of wires that connect a single bit output from the counter to a single control line. Another example decide circuit comprises a two bit to four bit decoder that accepts a two-bit counter input and provides four separate control signals, one for each variable resistor circuit. Another example decode circuit is arranged accept multiple counter bits (e.g. from a four bit counter) to a fewer number of control signals (e.g., two signals). In still another example decode circuit, the decode circuit is arranged to cooperate with a voltage boost circuit to provide boosted control signals. Various other examples are also contemplated where multi-bit counter outputs are used to generate control signals as may be desired.

Resistance circuit XRES12 has an effective resistance between terminals T11 and T22 that may be varied in response to signal ADJ12. The resistance circuit (XRES12) includes multiple variable resistor circuits (XRP) that are coupled together in parallel between terminals T11 and T22. Each of the variable resistor circuits (XRP) may be matched to one another, or scaled relative to one another as may be necessary to provide an overall adjustment range for the effective resistance between terminals T11 and T22. Similar decode arrangements as those previously described may be implemented for resistance circuit XRES12, resulting in one common adjustment signal (ADJP) or many separate adjustment signals (ADJP1, ADJP2, ADJP3 . . . ).

In a further example circuit, a combination of series and parallel connected variable resistor circuits may be arranged to provide a desired nominal resistance value, as well as a desired adjustment range.

Detailed Example Variable Resistance Circuit

Figure 3:
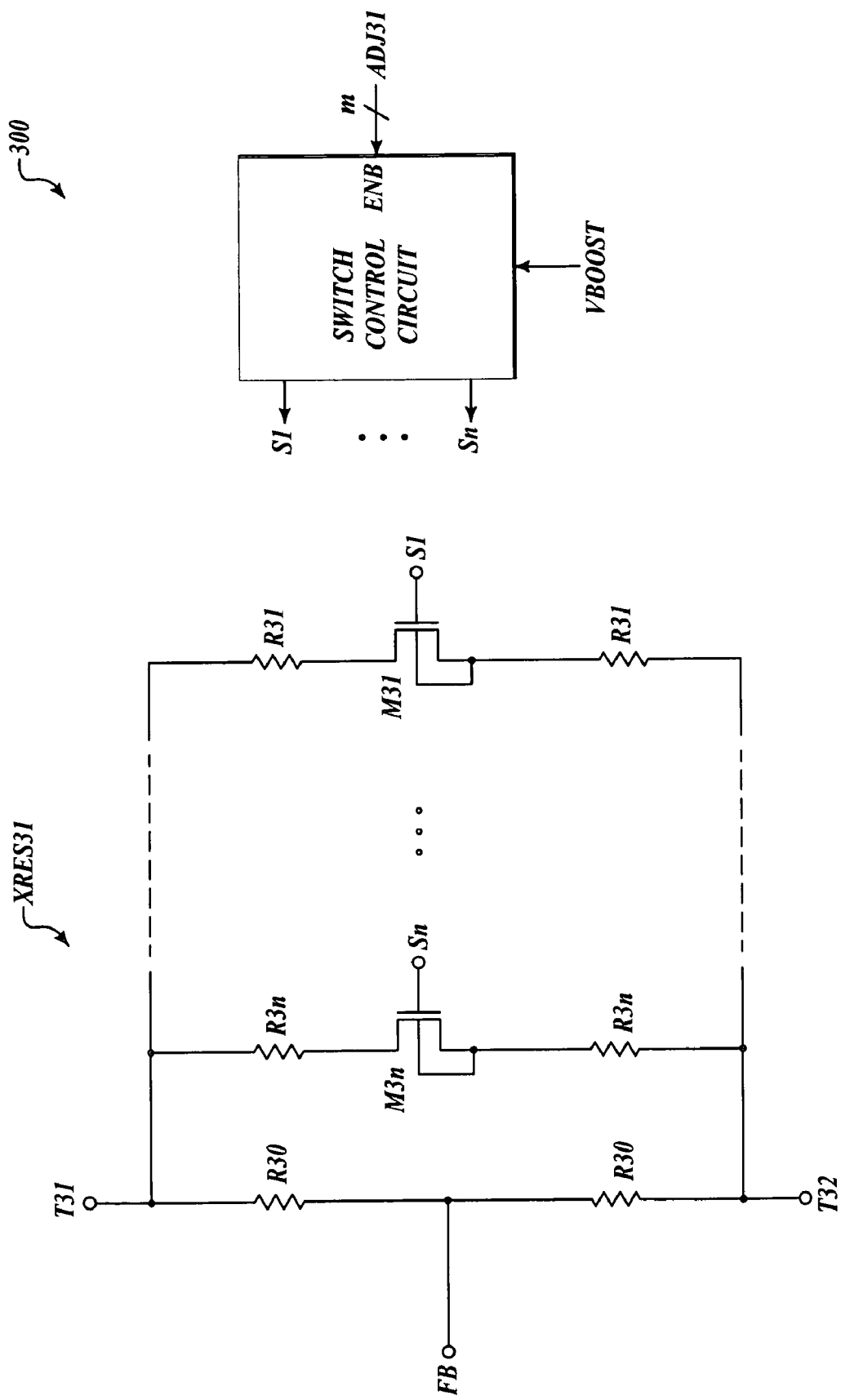
FIG. 3 is an illustrative schematic diagram of another example adjustable resistance circuit that may be utilized by an on-chip resistor calibration system.

FIG. 3 is an illustrative schematic diagram of an example variable resistance circuit (e.g., XRES1, XRES2 from FIG. 1) that may be utilized by an on-chip resistor calibration system. The example variable resistance circuit (300) includes a variable resistor circuit (XRES31), and a switch control circuit.

The switch control circuit includes an input that is coupled to an adjustment signal (ADJ31) that corresponds to a multi-bit (e.g., m-bit) digital control word, another input that is coupled to an optional voltage boost signal (VBOOST), and an output that provides a plurality of switch control signal (S1-Sn). The variable resistor circuit (XRES31) includes a fixed resistance portion that is coupled in parallel with a variable resistance portion. The fixed resistance portion includes two resistors (R30, R30) that are series coupled between terminals T31 and T32, with a common point that is designated as signal FB. The variable resistance portion includes a plurality of selectable resistor circuits that are coupled together in parallel between terminals T31 and T32. Each variable resistor circuit (1 . . . n) includes two resistors (e.g., R31, R31) that are coupled together between terminals T31 and T32 though a switching circuit that is illustrated as a single transistor (e.g., M31). Each variable resistor circuit (1 . . . n) may be selectively enabled or disabled via a respective switch control signal (S1-Sn). Resistors R31 through R3n may have resistance values that are: identical to one another, binary scaled relative to one another, logarithmically scaled relative to one another, linearly scaled relative to one another, or some other combination thereof.

In one example, the switching circuits include minimum sized transistors for the particular semiconductor process such that non-ideal capacitances associated with the transistors are also minimal. For this example, the non-ideal series resistance of the transistors is related to a signal level associated with the switch control signals (S1-Sn). A high gate drive signal results in a lower relative value to for the on-resistance associated with the switch (e.g., the transistor that is operated as a switch). For example, transistor M31 has a source-drain capacitance that can be minimized by a minimal sized physical implementation of the transistor (e.g., a minimal channel width and a minimal channel length). The switch control signal (i.e., provided by the switch control circuit) is provided to the gate of the switching transistor (or switch circuit) with an increased signal level (e.g., above the local power supply voltage) such that the overall series resistance between the source and drain terminals of the transistor are minimal.

Resistance circuit XRES31 has an effective resistance between terminals T31 and T32 that may also be varied in response to signal ADJ31. The resistance circuit (XRES31) includes multiple resistor circuits that are coupled together in parallel between terminals T31 and T32. Resistors R30, R30 are always active in the circuit such that the highest resistance value for resistance circuit XRES31 is determined by twice the value of the resistance associated with R30. Signal FB is approximately half-way between the voltage at terminals T31 and T32. Resistors R31, R31 are isolated from one another when transistor M31 is inactive such that they do not affect the overall resistance between terminals T31 and T32. Similarly, resistors R3n, R3n are isolated from one another when transistor M3n is inactive such that they do not affect the overall resistance between terminals T31 and T32. Control signals S1 through Sn have an associated Boolean value (i.e., a logical value of "0" or "1") that can be expressed as binary values b1 through bn. The selective activation of transistors M31 through M3n in response to control signals S1 through Sn provides a reduction in the effective resistance between terminals T31 and T32 according to the overall parallel combination, which can be expressed as:

$$\frac{1}{RES} \equiv \frac{1}{2 \times R30} + \frac{b1}{2 \times R31} + \ldots + \frac{bn}{2 \times R3n}$$

FIG. 3 illustrates an example adjustable resistance circuit that includes a number of selectable parallel resistances. Other adjustable resistance circuits can be implemented such as, for example, a number of selectable series resistances that are bypassed by switching circuits, as well as a combination of series and parallel selectable resistances.

Example Switch Control Circuit

Figure 4:
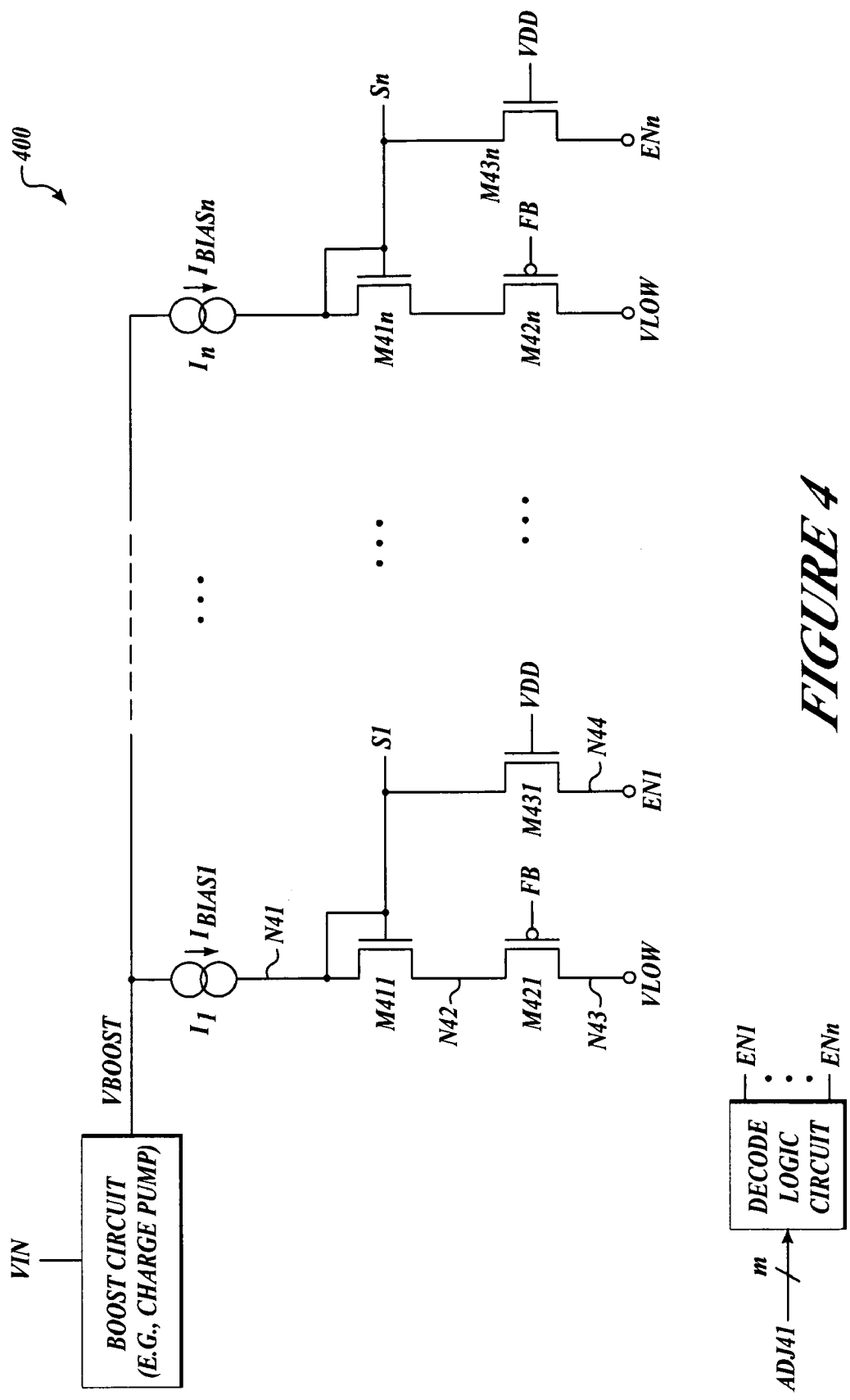
FIG. 4 is an illustrative schematic diagram of an example switch control circuit that may be utilized by an on-chip resistor calibration system.

FIG. 4 is an illustrative schematic diagram of an example switch control circuit (400) that may be utilized by an on-chip resistor calibration system. The example switch control circuit (400) includes a voltage boost circuit (e.g., a charge pump circuit), a decode logic circuit, an array of current sources (I1 though In), and an array of transistor circuits (M411/M421/M421 through M41n/M42n/M43n).

The voltage boost circuit is arranged to receive an input voltage (VIN), such as a power supply voltage, and provide a boost voltage (VBOOST) that is greater than the input voltage (VIN). The decode logic circuit is arranged to provide enable signals EN1 through ENn in response to signal ADJ41 (which is an m-bit signal). Current source I1 is coupled between the boost voltage and node N41, and arranged to provide current IBIAS1 to node N41. Transistor M411 is configured to operate as a diode that generates signal S1, and is coupled between nodes N41 and N42. Transistor M421 is coupled between nodes N42 and N43, and includes a gate terminal that is coupled to signal FB. Transistor M431 is coupled between nodes N41 and N44, and includes a gate terminal that is coupled to a power signal (e.g., VDD). Current source In and transistors M41n/M42n are arranged similar to current source I1 and transistors M411/M421. Node N43 is coupled to a low power supply signal (VLOW) or a ground signal (GND).

Transistor M431 is arranged to couple node N41 to a low logic level (logical "0") when signal EN1 corresponds to a low logic level. When signal EN1 is a high logic level (logical "1"), transistor M431 is inactive and transistor M411 operates similar to a forward biased diode to provide signal S1. Transistors M41n-M43n and current source In are arranged similar to transistors M411-M431 and current source I1 as illustrated in FIG. 4. However, transistor M43n is responsive to signal ENn to allow the selective disabling of signal Sn on the gate of transistor M41n.

Switch control circuit 400 is arranged to cooperate with an adjustable resistance circuit such as that described previously with respect to FIG. 3. For example, signal FB in FIG. 4 corresponds to an operating voltage that is approximately half way between the voltage associated with terminals T31 and T32 from FIG. 3. Transistor M421 is disabled when signal EN1 is coupled to a circuit ground, and enabled when signal EN1 corresponds to a high voltage (e.g., approximately VDD). When transistor M421 is enabled by signal EN1, the voltage at node N42 is determined by the gate-source voltage (VGSP) of transistor M421 and signal VFB. Transistor M411 is active when transistor M421 is active, and develops a gate-source voltage (VGSN) across nodes N41 and N42. The voltage at node N41 corresponds to signal S1, and has a value that is give by VS1=VFB+VGSP+VGSN. Referring to FIG. 3, example switch transistor M31 has drain and source voltages that are approximately equivalent to VFB. Thus, the control signal across the gate of transistor M31 is a relatively constant VGS signal that is given as: VGSM31=VGSN+VGSP. It is important to note that the VFB term drops out of the equation for the gate-source voltage of transistor M31. This cancellation effect is the result of the feedback signal (VFB) from the adjustable resistor circuit, which is a measure of the common mode operating voltage of the switching transistor during operation of the adjustable resistor circuits.

In a first circuit implementation, a single adjustable resistance circuit is used for the XRES1 circuit block from FIG. 1. For this first implementation, there is a single feedback signal (e.g., VFB) that is sensed from the adjustable resistance circuit and provided to the switch control circuit (e.g., FIG. 4).

In a second circuit implementation, a set of series coupled adjustable resistance circuits are used (e.g., see XRES11 from FIG. 2) for the XRES1 circuit block from FIG. 1. For this second implementation, there are separate feedback signals (VFB1, VFB2 . . . VFBN) from each adjustable resistor (e.g., XRS) that is provided to separate switch control circuits (e.g., FIG. 4) for each adjustable resistance circuit. Although each adjustable resistor may have the same potential drop across them, each adjustable resistor may also have a different common-mode operating voltage. One benefit that has been observed from the series resistance circuit of FIG. 2 is that a larger input signal will be provided to the input of the comparator, resulting a division of any error terms (e.g., GND error, mismatches in resistor segments, etc.) based on the number of series coupled resistance circuits.

The series resistance and the source/drain capacitance that is associated with the switching transistor (e.g., M31 from FIG. 3) are minimized by voltage boosting of the gate drive signal (e.g., S1 from FIG. 3). "Stacked" series adjustable resistors (e.g., multiple XRS blocks in series as shown by XRES11 in FIG. 2) have improved overall performance.

Example Calibration Flow Diagram

Figure 5:
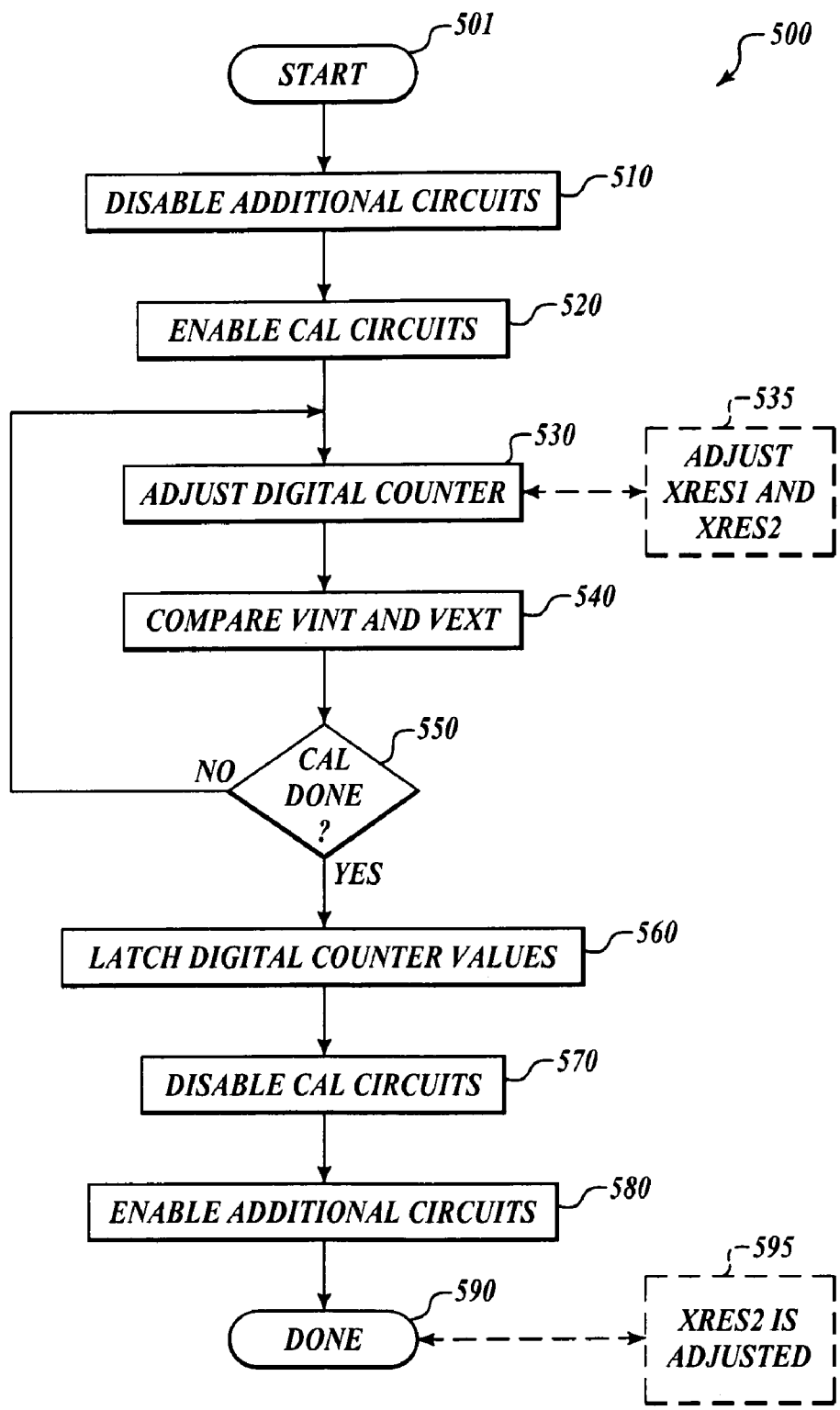
FIG. 5 is an illustrative procedural flow diagram for an on-chip resistor calibration system.

FIG. 5 is an illustrative procedural flow diagram (500) for an on-chip resistor calibration system. Processing begins at block 501 when the calibration mode is activated. The calibration mode may be activated by detecting a power-on reset (POR) signal, by selecting a specified calibration mode, by selecting a particular test mode, or some other mechanism that allows activation of the calibration mode.

Processing continues to block 510, where additional circuits (e.g., those circuits that are not required for operation of the calibration procedure) are disabled. Processing continues at block 520 where the various calibration circuits are enabled. Example additional circuits are illustrated in FIG. 1 as circuit block X4, while the remaining circuits of FIG. 1 are necessary for calibration.

In one example implementation, the counters and/or latches are cleared when the calibration circuits are enabled. In another example implementation, the counters and/or latches are initialized to a default condition when the calibration circuits are enabled. In still another example implementation, the counters and/or latches are preloaded with a previously stored condition when the calibration circuits are enabled.

Continuing to block 530, the digital counter block evaluates the current status of the comparison between the internal and external voltages (e.g., node N3 from FIG. 1) and adjusts its count accordingly (e.g., increases or decreases the count). The change in the count is applied to the various adjustable or variable resistance circuits (e.g. XRES1, XRES2 from FIG. 1) as illustrated by block 535. At block 540, the internally generated voltage (VINT) is compared to the voltage (VEXT) across the external resistor (REXT). Continuing to decision block 550, the calibration system evaluates the comparison to determine if additional cycles of the counter adjustment are necessary. When additional cycles of calibration are necessary, processing blocks 530-550 are repeated. Otherwise, processing flows from block 550 to block 560 when calibration is complete.

In one example, calibration is executed over a predetermined time period. In another example, calibration is executed over a fixed number of cycles of a clock signal. In still another example, calibration is executed until the counter output converges on a particular count value. In yet another example, calibration is terminated under user control (e.g., by a test program) by: asserting a signal, deasserting a signal, or providing an instruction to the integrated circuit is some other manner.

At block 560, the calibration operation is complete and the value (or values) associated with the counter are effectively stored. The value can be stored in a latch, a memory, a register, an EPROM, an EEPROM, or any other desired device. in another example, the digital counter includes a mechanism for maintaining the count value without a separate storage mechanism.

Continuing to block 570, the various calibration circuits are disabled. Proceeding to block 580, the additional circuits are enabled for operation. The calibration method results in one or more digital control signals (e.g., one or more digital control bits) that are used to adjust the operational resistance (e.g., at block 595) of another resistance circuit (e.g. XRES2) that is used by the additional circuits under another operating mode (e.g., a normal operating mode, or some other non-calibration operating mode). The resistance of the other circuit may be used as a terminating resistor in a high performance circuit such as: a USB receiver, an LVDS receiver, or some other application where impedance matching is critical to minimize signal reflections.

Processing is concluded at block 590. The resistor that is described with respect to REXT may be a high performance resistor that is used as a reference during the calibration mode. After the calibration mode is concluded, the resistor is no longer necessary and can be used for some other application. In one application, the resistor is used as a reference for a biasing circuit. In another application, the resistor is used as a reference for a voltage regulator. In still another application, the resistor is used as a standard of measure for an analog-to-digital converter (ADC) or a digital-to-analog converter (DAC). Many other uses of the resistor are possible.

The above disclosure has many possible benefits over previously attempted implementations. In one example, non-essential circuits are disabled during the resistor calibration phase. In this example, various voltage drops caused by current flowing through various physical materials (e.g., metals, bond wires, lead frames, package pins, etc.) are minimized since non-essential (those circuits unrelated to the resistor calibration) are disabled. In another example, switch voltages are boosted so that both the resistors in the calibration circuit (e.g., XRES1 from FIG. 1), and any other calibrated resistors (e.g. XRES2 from FIG. 1), can be biased at different common mode voltages. In still another example, several trim resistors (e.g., XRES1 from FIG. 1, and XRES11 from FIG. 2) are stacked in series to develop a larger comparator input voltage, such that various non-ideal effects can be minimized (e.g., comparator mismatch and internal versus external ground differences).

Although the invention has been described herein by way of exemplary embodiments, variations in the structures and methods described herein may be made without departing from the spirit and scope of the invention. For example, the positioning of the various components may be varied. Individual components and arrangements of components may be substituted as known to the art. Since many embodiments of the invention can be made without departing from the spirit and scope of the invention, the invention is not limited except as by the appended claims.

What is claimed is:

1. An apparatus for adjusting an on-chip resistance with an off-chip resistor, comprising:
    a sense circuit that includes a variable resistance circuit, wherein the sense circuit is arranged to generate a first voltage across the variable resistance circuit, to generate a second voltage across the off-chip resistor, and to compare the first voltage to the second voltage to provide a status signal;
    an up/down counter circuit that is arranged to provide a counter signal in response to an evaluation of the status signal, wherein the variable resistance circuit of the sense circuit has a first resistance value that is adjusted in response to the counter signal;
    an adjusted resistance circuit that has a second resistance value that is adjusted in response to the counter signal, the adjusted resistance circuit comprising:
        a first resistor that is coupled between a first node and a feedback node;
        a second resistor that is coupled between the feedback node and a second node, wherein the first resistor and the second resistor have matched resistance values;
        a third resistor that is coupled between the first node and a third node;
        a fourth resistor that is coupled between a fourth node and the second node, wherein the third resistor and the fourth resistor have matched resistance values; and
        a transistor that is arranged to selectably couple the third node to the fourth node in response to a control signal, whereby the selective coupling of the first and second resistors in parallel with the third and fourth resistors provides an adjustment of a resistance value associated with the adjustable resistance circuit.

2. The apparatus of claim 1, wherein the sense circuit and the up/down counter circuit are provided in a first functional portion of an integrated circuit, and wherein the adjusted resistance circuit is provided as a second functional portion of the integrated circuit that is unrelated to the first functional portion of the integrated circuit.

3. The apparatus of claim 1, wherein the adjusted resistance circuit forms at least a portion of an on-chip impedance matching circuit that is calibrated for impedance matching.

4. The apparatus of claim 1, wherein the adjusted resistance circuit and the variable resistance circuit from the sense circuit are manufactured from the same materials such that at least one of their performance parameters track one another over semiconductor process variations.

5. The apparatus of claim 1, the sense circuit further comprising a current mirror circuit that is arranged to provide a first current to the variable resistance circuit, and a second current to the off-chip resistor.

6. The apparatus of claim 5, wherein the first current and the second current are related to one another by a scaling factor (X), and wherein a design value associated with the variable resistance circuit is related to a value associated with the off-chip resistor according to the scaling factor (X).

7. The apparatus of claim 1, wherein the sense circuit further comprises a comparator circuit, wherein the comparator circuit is arranged to provide the status signal in response to a comparison of the first voltage and the second voltage.

8. The apparatus of claim 1, the variable resistance circuit further comprising: a plurality of adjustable resistor circuits that are coupled together in at least one of a parallel configuration and a series configuration.

9. The apparatus of claim 1, the variable resistance circuit further comprising:
    a fifth resistor that is coupled between a first terminal and a second terminal; and
    a sixth resistor that is selectably coupled between the first terminal and the second terminal in response to the control signal, whereby the selective coupling of the fifth resistor in parallel with the sixth resistor provides an adjustment of a resistance value associated with the variable resistance circuit.

10. The apparatus of claim 1, the variable resistance circuit further comprising: a plurality of adjustable resistor circuits that are coupled together in series, wherein each adjustable resistor circuit comprises:

a fifth resistor that is coupled between the first node and a fifth node;

a sixth resistor that is coupled between a sixth node and the second node, wherein the fifth resistor and the sixth resistor have matched resistance values; and a second transistor that is arranged to selectably couple the fifth node to the sixth node in response to a second control signal, wherein the values associated with the first resistor and at least one of the third resistor and the sixth resistor are related to one another according to a scaling relationship.

11. The apparatus of claim 10, wherein the scaling relationship corresponds to at least one of: an integer scaling factor, a non-integer scaling factor, a binary weighted scaling factor, a logarithmically weighted scaling factor, and a linearly related scaling factor.

12. The apparatus of claim 1, the up/down counter circuit further comprising a means for latching the count such that a value associated with the up/down counter is maintained when the apparatus is operated in an operating mode that is different from calibration.

13. The apparatus of claim 12, wherein the means for latching comprises at least one of: a latch circuit, a memory circuit, a register circuit, an EPROM circuit, and an EEPROM circuit.

14. The apparatus of claim 1, further comprising a calibration control circuit that is arranged to enable the operation of the sense circuit and the up/down counter circuit during a calibration mode, and disable the sense circuit and the up/down counter circuit during a non-calibration mode.

15. The apparatus of claim 14, wherein the adjusted resistance circuit is arranged as a terminating resistor for an additional circuit that is operational in the non-calibration mode.

* * * * *